United States Patent [19]

Yanagihara et al.

[11] Patent Number: 5,051,333
[45] Date of Patent: Sep. 24, 1991

[54] OPTICAL IMAGE-RECORDING MATERIAL

[75] Inventors: Naoto Yanagihara; Ken Iwakura; Tosiaki Endo; Keiso Saeki, all of Shizuoka, Japan

[73] Assignee: Fuji Photo Film Co., Ltd., Kanagawa, Japan

[21] Appl. No.: 541,865

[22] Filed: Jun. 21, 1990

[30] Foreign Application Priority Data

Jun. 22, 1989 [JP] Japan .................................. 1-160155
Mar. 8, 1990 [JP] Japan .................................... 2-57659

[51] Int. Cl.$^5$ .............................................. G03C 1/72
[52] U.S. Cl. ................................. 430/438; 430/203; 430/211; 430/224; 430/332; 430/343; 430/344; 503/214; 503/217; 503/218
[58] Field of Search ............... 430/138 AG, 332, 343, 430/344, 211, 224, 203; 503/214, 218, 217

[56] References Cited

U.S. PATENT DOCUMENTS 4,247,618  1/1981  Desauer et al. .
4,622,566  11/1986  Kasamatsu et al. .................. 503/214
4,942,107  7/1990  Saeki et al. .......................... 430/138

FOREIGN PATENT DOCUMENTS 1-102074  4/1989  Japan .

Primary Examiner—Charles L. Bowers, Jr.
Assistant Examiner—Thorl Chea
Attorney, Agent, or Firm—Sughrue, Mion, Zinn Macpeak & Seas

[57] ABSTRACT

An optical image-recording material comprising:
(a) microcapsules, in which at least one leuco dye capable of forming a color by oxidation and at least one photo-oxidizing agent are enclosed together, and (b) at least one reducing agent not enclosed in the microcapsules, or
(c) microcapsules, in which at least one reducing agent is enclosed, and (d) both at least one leuco dye capable of forming a color by oxidation and at least one photo-oxidizing agent not enclosed in the microcapsules,
wherein the microcapsules have capsule walls made from a material which lowers its permeability barrier to at least one component selected from the photo-oxidizing agent and the reducing agent when the capsule wall material is heated above its glass transition temperature, and the leuco dye is a xanthene compound having an N-substituted anilino group substituted by an electron attracting group.

11 Claims, No Drawings

OPTICAL IMAGE-RECORDING MATERIAL

FIELD OF THE INVENTION

This invention relates to an optical image-recording material and, more particularly, to a leuco dye type optical image-recording material capable of being fixed. Still more particularly, it relates to an optical image-recording material which can form an image having an excellent stability and having a black hue.

BACKGROUND OF THE INVENTION

Optical image-forming materials find many photographic applications, for example, for use as proof papers, printing-out papers, overlay films, etc. These are so-called free radical photographs in which imagewise exposed portions are visualized.

A particularly effective process in relation to the materials is a process of oxidizing various leuco dyes to corresponding colored dyes using a photo-oxidizing agent. However, since materials based on such a process are sensitive to light, color formation can take place even when there is exposure to ordinary room light, sunlight or white light, and even after formation of dye image by imagewise exposure. Thus, such optical image-recording materials are difficult to handle.

As techniques for preventing coloration of imagewise unexposed portions for the purpose of maintaining a once formed image, there have been proposed a technique of applying a solution of a reducing agent such as a free radical scavenger by spraying or impregnation to thereby maintain the originally recorded image, a technique of forming an image by UV light and fixing the material by activating a photo-reductive substance with visible light as described, for example, in JP-A-47-12879 (the term "JP-A" as used herein refers to a "published unexamined Japanese patent application"), and a technique of incorporating or coating a reducing, thermally fixing agent in or on a light-sensitive layer, and conducting thermal fixing after imagewise exposure as described in JP-B-43-29407 (the term "JP-B" as used herein refers to an "examined Japanese patent publication"). Of leuco dyes to be used in such optical image-forming materials, xanthene compounds having an anilino group in the 2-position, an alkyl group in the 3-position, and a substituted amino group in the 6-position are known as dyes showing a black hue in a colored state. However, such compounds have a defect in that they do not provide sufficient coloration density, and thus are not satisfactory.

SUMMARY OF THE INVENTION

It is, therefore, an object of the present invention to provide an optical image-recording material capable of providing sufficient coloration density.

This and other objects of the present invention will become apparent from the following description.

The above described and other objects of the present invention are attained by an optical image-recording material comprising:

(a) microcapsules, in which at least one leuco dye capable of forming a color by oxidation and at least one photo-oxidizing agent are enclosed together, and (b) at least one reducing agent not enclosed in the microcapsules, or (c) microcapsules, in which at least one reducing agent is enclosed, and (d) both at least one leuco dye capable of forming a color by oxidation and at least one photo-oxidizing agent not enclosed in the microcapsules, wherein the microcapsules have capsule walls made from a material which lowers its permeability barrier to at least one component selected from the photo-oxidizing agent and the reducing agent when the capsule wall material is heated above its glass transition temperature, and the leuco dye is a xanthene compound having an N-substituted anilino group substituted by an electron attracting group.

DETAILED DESCRIPTION OF THE INVENTION

The leuco dye which constitutes one component of the optical image-recording material of the present invention is of a reduced form of a dye, having one or two hydrogen atoms, and forms a color when the hydrogen atom or atoms is(are) removed or, in some cases, when an additional electron or electrons is(are) added thereto. Such leuco dyes are substantially colorless or possess only a slight color, and hence they may be used as a means for forming a pattern by utilizing coloration thereof caused by oxidation. In the present invention, this oxidation can be attained by allowing a photo-oxidizing agent to exist in the system. This photo-oxidizing agent is activated by irradiation with light and reacts with the activated leuco dye to produce a colored image only in the light-irradiated portions.

Preferably, the leuco dyes in accordance with the present invention having a xanthene skeleton and being capable of forming color upon being oxidized are substituted by an optionally substituted aromatic ring in the 9-position of the xanthene skeleton.

As the leuco dyes used in accordance with the present invention having a xanthene skeleton and being capable of forming color upon being oxidized, those which are represented by the following general formula (I) are preferred:

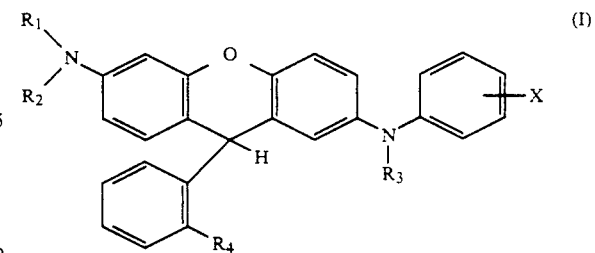

(I)

wherein $R_1$ and $R_2$, which may be the same or different, each represents an alkyl group (preferably having 1 to 8 carbon atoms), an alkenyl group (preferably having 3 to 8 carbon atoms), an alkynyl group (preferably having 3 to 8 carbon atoms) or an aryl group (preferably having 6 to 12 carbon atoms), $R_3$ represents an alkyl group (preferably to 12 carbon atoms), $R_4$ represents an alkyl group (preferably having 1 to 8 carbon atoms), a carbamoyl group (preferably having 1 to 12 carbon atoms, which may be substituted by an alkyl group or an aryl group), a substituted amino group (preferably having 2 to 12 carbon atoms, which is substituted by one or two of the same or different substituents of an alkyl group, an aryl group, an acyl group or a sulfonyl group) or $-COOR_5$ (wherein $R_5$ is an alkyl group, preferably having 1 to 12 carbon atoms), and X represents an electron attracting group.

In the compounds of formula (I), these substituents may be combined each other to form a fused ring with the xanthene ring or the benzene ring in the 9-position thereof, and each benzene ring in the xanthene ring may have one or two substituents and the benzene ring in the 9-position may have from 1 to 4 substituents.

In the above formula, those groups which are represented by $R_1$ and $R_2$ may further be substituted by an alkyl group, an aryl group, an alkoxy group, an aryloxy group, an alkylthio group, a halogen atom, a nitro group, a cyano group, a hetero ring or the like. These substituents may further possess a substituent or substituents. Specific examples of $R_1$ and $R_2$ include —H, —CH$_3$,

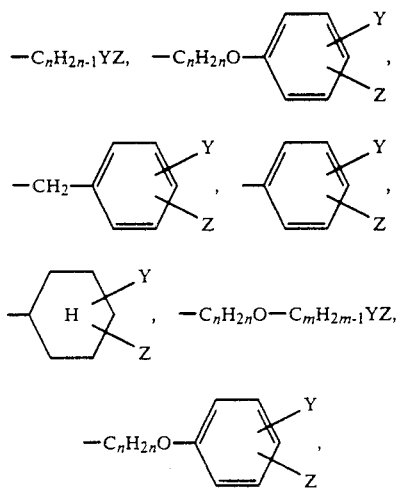

wherein n represents an integer of 2 to 10, m represents an integer of 1 to 5, Y and Z each represents an alkyl group, an alkenyl group, an alkynyl group, an aryl group, a hydrogen atom, an alkoxy group, an alkylthio group, a halogen atom, a nitro group, a cyano group or the like.

$R_1$ and $R_2$ may be connected to each other to form a ring having a hetero atom or an unsaturated bond.

In the general formula (I), the groups represented by $R_3$ and $R_5$ may be substituted by an alkynyl group, an aryl group, an alkoxy group, an aryloxy group, an alkylthio group, a halogen atom, a nitro group, a cyano group, or the like. These substituents may further have a substituent or substituents. As $R_3$ and $R_5$, an alkyl group, an aryl-substituted alkyl group, an alkoxy-substituted alkyl group, a halogen-substituted alkyl group, etc., are preferred.

In the general formula (I), the group represented by $R_4$ may be substituted, for example, by an alkyl group, an alkoxy group, an aryloxy group, a hydroxy group, a halogen atom or an acyl group. These substituents may further have a substituent or substituents. $R_4$ preferably represents an alkyl group, an aryloxyalkyl group, an alkoxyalkyl group, a substituted carbamoyl group, an acylamino group, —COOR$_5$ (wherein $R_5$ is as defined above), or the like.

As the electron attracting group represented by X, a trifluoromethyl group, a nitro group, an acyl group, an alkoxycarbonyl group, an aryloxycarbonyl group, an alkylsulfonyl group, an alkylsulfonyloxy group, an arylsulfonyl group, an arylsulfonyloxy group, an aryloxysulfonyl group, an N-substituted carbamoyl group, an N-substituted sulfamoyl group, a halogen atom and a cyano group are preferred, with a trifluoromethyl group, an alkylsulfonyl group, an arylsulfonyl group, an N,N-dialkylsulfamoyl group, an aryloxysulfonyl group, etc., being particularly preferred.

Specific examples of the xanthene compounds in accordance with the present invention are illustrated below which, however, do not limit the present invention in any way.

That is, there are illustrated 9-(2-methoxycarbonylphenyl)-2-N-ethyl-N-m-trifluoromethylphenylamino-6-diethylaminoxanthene, 9-(2-ethoxycarbonylphenyl)-2-N-ethyl-N-m-trifluoromethylphenylamino-6-diethylaminoxanthene, 9-(2-butoxycarbonylphenyl)-2-N-ethyl-N-m-trifluoromethylphenylamino-6-diethylaminoxanthene, 9-(2-methoxycarbonylphenyl)-2-N-butyl-N-m-trifluoromethylphenylamino-6-diethylaminoxanthene, 9-(2-methoxycarbonylphenyl)-2-N-octyl-N-m-trifluoromethylphenylamino-6-diethylaminoxanthene, 9-(2-methoxycarbonylphenyl)-2-N-(2-ethylhexyl)-N-m-trifluoromethylphenylamino-6-diethylaminoxanthene, 9-(2-methoxycarbonylphenyl)-2-N-butyl-N-m-trifluoromethylphenylamino-6-dibutylaminoxanthene, 9-(2-methoxycarbonylphenyl)-6-N-ethyl-N-m-trifluoromethylphenylamino-2-N-isoamyl-N-ethylaminoxanthene, 9-(2-methoxycarbonylphenyl)-2-N-octyl-N-m-trifluoromethylphenylamino-6-diethylaminoxanthene, 9-(2-methoxycarbonylphenyl)-2-N-ethyl-N-m-trifluoromethylphenylamino-6-N-tetrafurfuryl-N-ethylaminoxanthene, 9-(2-benzyloxycarbonylphenyl)-2-N-ethyl-N-m-trifluoromethylphenylamino-6-diethylaminoxanthene, 9-(2-methoxycarbonylphenyl)-2-N-butyl-N-m-methylsulfonylphenylamino-6-diethylaminoxanthene, 9-(2-methoxycarbonylphenyl)-2-N-butyl-N-m-phenylsulfonylphenylamino-6-diethylaminoxanthene, 9-(2-methoxycarbonylphenyl)-2-N-butyl-N-m-phenoxysulfonylphenylamino-6-diethylaminoxanthene, 9-(2-methoxycarbonylphenyl)-2-N-butyl-N-p-diethylsulfamoylphenylamino-6-diethylaminoxanthene, 9-(2-methoxycarbonylphenyl)-2-N-butyl-N-p-methylsulfonylphenylamino-6-diethylaminoxanthene, 9-(2-methoxycarbonylphenyl)-2-N-butyl-N-p-phenoxysulfonylphenylamino-6-diethylaminoxanthene, 9-(2-methoxycarbonylphenyl)-2-N-butyl-N-p-cyanophenylamino-6-diethylaminoxanthene, 9-(2-methylphenyl)-2-n-ethyl-N-m-trifluoromethylphenylamino-6-diethylaminoxanthene, 9-(2-methoxymethylphenyl)-2-N-ethyl-N-m-trifluoromethylphenylamino-6-diethylaminoxanthene, 9-(2-hydroxymethylphenyl)-2-N-ethyl-N-m-trifluoromethylphenylamino-6-diethylaminoxanthene, 9-(2-acyloxymethylphenyl)-2-N-butyl-N-m-trifluoromethylphenylamino-6-diethylaminoxanthene, 9-(2-diethylaminocarbonylphenyl)-2-N-octyl-N-m-trifuloromethylphenylamino-6-diethylaminoxanthene, 9-(2-diphenylaminocarbonylphenyl)-2-N-(2-ethylhexyl)-N-m-trifuloromethylphenylamino-6-diethylaminoxanthene, 9-(2-butylphenyl)-2-N-butyl-N-m-trifuloromethylphenylamino-6-dibutylaminoxanthene, 9-(2-ethoxymethylphenyl)-2-N-ethyl-N-m-trifuloromethylphenylamino-6-N-isoamyl-N-ethylaminoxanthene, 9-(2-phenoxymethylphenyl)-2-N-octyl-N-m-trifuloromethylphenylamino-6-diethylaminoxanthene, 9-(2-diethylaminophenyl)-2-N-ethyl-N-m-trifuloromethylphenylamino-6-N-tetrafurfuryl-N-ethylaminoxanthene, 9-(2-benzyloxymethylphenyl)-2-N-ethyl-N-m-trifluoromethylphenylamino-6-diethylaminoxanthene, 9-(2-methylphenyl)-2-N-butyl-N-m-methylsulfonylphenylamino-6-diethylaminoxanthene, 9-(2-methoxymethylphenyl)-2-N-butyl-N-m-phenylsulfonyl-phenylamino-6-diethylaminoxanthene, 9-(2-acetylaminophenyl)-2-N-butyl-N-m-phenoxysulfonyl-phenylamino-6-diethylaminoxanthene, 9-(2-methoxymethylphenyl)-2-N-butyl-N-p-diethylsulfamoyl-phenylamino-6-diethylaminoxanthene, 9-(2-methoxymethylphenyl)-2-N-butyl-N-p-methylsulfonyl-phenylamino-6-diethylaminoxanthene, 9-(2-ethoxymethylphenyl)-2-N-butyl-N-p-phenoxysulfonyl-phenylamino-6-diethylaminoxanthene, 9-(2-phenylmethylphenyl)-2-N-butyl-N-p-cyanophenylamino-6-diethylaminoxanthene, etc.

The xanthene compounds according to the present invention can be easily synthesized by the ordinary method as described, for example, in JP-A-1-102074. For example, the xanthene compounds can be obtained by reducing the corresponding fluoran compound to obtain a reduced form (a compound of formula (I) wherein $R_4$ is —COOH), and then subjecting the reduced compound to the alkylation, the amidation or the conversion of functional group.

In addition to the above illustrated compounds, leuco dyes which have another skeleton may be used therewith in combination as leuco dyes in accordance with the present invention for the purpose of adjusting color tone. As the dyes to be used in combination with those of the present invention, those which are described, for example, in U.S. Pat. No. 3,445,234 are preferred.

Specific examples thereof include Leuco Crystal Violet, tris(4-diethylamino-o-tolyl)methane, bis(4-diethylamino-o-tolyl)phenylmethane, bis(4-diethylamino-o-tolyl)thienyl-2-methane, bis(2-chloro-4-diethylamino-phenyl)phenylmethane, 2-(2-chlorophenyl)amino-6-N,N-dibutylamino-9-(2-methoxycarbonyl)phenylxanthene, 2-N,N-dibenzylamino- 6-N,N-diethylamino-9-(2-methoxycarbonyl)phenylxanthene, benzo[a]-6-N,N-diethylamino-9-(2-methoxycarbonyl)phenylxanthene, 2-(2-chlorophenyl)amino-6-N,N-dibutylamino-9-(2-methylphenylcarboxamido)phenylxanthene, 3,6-dimethoxy-9-(2-methoxycarbonyl)phenylxanthene, 3,6-diethoxyethyl-9-(2-methoxycarbonyl)phenylxanthene, benzoyl leuco methylene blue, 3,7-bis-diethylaminophenoxazine, etc.

On the other hand, the photo-oxidizing agent to be used in the optical image-recording material of the present invention is a compound which is normally inert but, when exposed to actinic radiation such as visible light, ultraviolet rays, infrared rays or X-rays, produces a compound capable of oxidizing a leuco dye to its colored form.

Typical photo-oxidizing agents include lophine dimer compounds such as 2,4,5-triarylimidazole dimers described, for example, in JP-B-62-39728 and JP-B-63-2099, azide compounds such as 2-azidobenzoxazole, example, in U.S. Pat. No. 3,282,693, pyridinium compounds such as 3'-ethyl-1-methoxy-2-pyridothiacyanine perchlorate, 1-methoxy-2-methylpyridinium p-toluenesulfonate, etc., described in U.S. Pat. No. 3,615,568, organic halogen compounds such as N-bromosuccinimide, tribromomethyl phenyl sulfone, 2-trichloromethyl-5-(p-butoxystyryl)-1,3,4-oxadiazole, 2,6-ditrichloromethyl-4-(p-methoxyphenyl)triazine, etc., and azide polymers described in *Photographic Society of Japan*, "Summaries of Lectures for 1968-Year Spring Research Presentation Meeting", page 55. Of these compounds, lophine dimer compounds and organic halogen compounds are suitable, with combined use of the lophine dimer compound and the organic halogen compound being optimal since a high sensitivity can be obtained.

In the optical image-recording material of the present invention, the ratio of the leuco dye to the photo-oxidizing agent to be used ranges preferably from 10/1 to 1/10, more preferably 2/1 to 1/5, in molar ratio.

The reducing agent in accordance with the present invention is a so-called free radical scavenger which traps the activated photo-oxidizing agent.

As specific examples of the reducing agent, there are illustrated hydroquinone compounds and aminophenol compounds which are described in U.S. Pat. No. 3,042,515 and have a first hydroxy group on the benzene ring and in which at least another hydroxy or amino group exists on another position of the benzene ring, cyclic phenylhydrazide compounds which are described in JP-B-62-39728, and compounds which are selected from among guanidine derivatives, alkylenediamine derivatives and hydroxyamine derivatives. These may be used alone or as a combination of two or more of them. However, the above is not limitative, and other reducing compounds which react with so-called oxidizing agents may also be used.

In the optical image-recording material of the present invention, the above described reducing agent is dispersed as solids using a sand mill or the like, or dissolved in an oil with emulsifying and dispersing the resulting solution. It is preferred to employ a protective colloid upon the solid dispersion or emulsion dispersion.

The reducing agent is used in a amount of preferably 1 to 100 mols, more preferably 2 to 20 mols, per mol of the photo-oxidizing agent component.

A specific embodiment of the optical image-recording material in accordance with the present invention is described below.

The optical image-recording material in accordance with the present invention contains the leuco dye, photo-oxidizing agent, and reducing agent as essential components, and both the leuco dye and the photo-oxidizing agent, or the reducing agent is microencapsulated, with microencapsulation of both the leuco dye and the photo-oxidizing agent being preferred.

Capsules of the kind which, at ordinary temperatures, inhibit contact between substances present inside and outside the capsules through the isolation function of the capsule walls, and lower their permeability barrier to the substances only when they are heated up to above certain temperatures, are preferred in the present invention. The permeation initiating temperature can be freely controlled by properly selecting the kind of a capsule wall-forming material, a capsule core material and additives. In this case, the permeation starting temperature corresponds to the glass transition temperature of the capsule wall (as described, e.g., in U.S. Pat. No. 4,529,681, JP-A-59-190886 and JP-A-60-242094, etc.).

In order to control the glass transition temperature inherent in the capsule wall, it is necessary to variously change the kinds of capsule wall-forming materials to be used. As examples of wall materials of microcapsules which can be used, mention may be made of polyurethane, polyurea, polyester, polycarbonate, ureaformaldehyde resin, melamine-formaldehyde resin, polystyrene, styrene-methacrylate copolymer, gelatin, polyvinyl pyrrolidone, polyvinyl alcohol, and so on. These high molecular weight substances can be used in combinations of two or more.

Among the foregoing high molecular weight substances, polyurethane, polyurea, polyamide, polyester and polycarbonate ar preferred for the present invention. In particular, polyurethane and polyurea are preferred over others.

The microcapsules are formed by emulsifying a core substance containing therein optical image-recording materials such as the leuco dye and the photo-oxidizing agent, and forming a wall of a high molecular substance around the emulsified oil droplets. In this case, wall-forming reactants are added to the interior and/or exterior of the oil droplets. Microencapsulation is specifically conducted according to processes described, for example, in U.S. Pat. Nos. 3,726,804 and 3,796,696 and Japanese Patent Application No. 62-259111 (corresponding to JP-A-2-44 and U.S. Pat. Ser. No. 257,580 filed on Oct. 14, 1988).

A the organic solvent for dissolving the above described optical image-recording materials, high boiling oils are used. Specific examples thereof include phosphoric acid esters, carboxylic acid esters such as phthalic acid esters, acrylic acid esters and methacrylic acid esters, fatty acid amides, alkylated biphenyls, alkylated terphenyls, alkylated naphthalenes, diarylethanes, and chlorinated paraffin.

In the present invention, a low boiling auxiliary solvent may be added to the above described organic solvents. Specific examples of the auxiliary solvent include ethyl acetate, isopropyl acetate, butyl acetate, methylene chloride and cyclohexanone.

In order to stably prepare the emulsified oil droplets, a protective colloid or a surface active agent may be added to the aqueous phase. As the protective colloid, a water-soluble high polymer compound is generally usable but, in order to improve water resistance, a carboxy-modified polyvinyl alcohol is preferably used.

In view of improvement of resolving power and handling ease, the microcapsules have a size of up to 20 $\mu$m, preferably up to 4 $\mu$m, in volume average size.

In the present invention, in order to stabilize the formed dye, an acidic substance may be added to the interior of the capsules. As the acidic substance, there are illustrated, for example, mineral acids such as hydrochloric acid, hydrobromic acid, sulfuric acid, nitric acid and phosphoric acid, aromatic sulfonic acid derivatives such as p-toluenesulfonic acid, benzenesulfonic acid, chlorobenzenesulfonic acid, nitrobenzenesulfonic acid, dodecylbenzenesulfonic acid and naphthalenesulfonic acid, aromatic carboxylic acid derivatives such as benzoic acid, chlorobenzoic acid, nitrobenzoic acid, hydroxybenzoic acid, toluic acid, salicylic acid, butylsalicylic acid, amylsalicylic acid, phenylsalicylic acid and naphthoic acid, and salts thereof.

In the present invention, known sensitizing agents, known ultraviolet ray absorbents and known antioxidants may be added to the interior of the capsules. The antioxidants are preferably phenol or amine type antioxidants, more preferably phenol type antioxidants. The amount of the antioxidants added is optionally determined, preferably 0.001 to 20 mol% based on the photo-oxidizing agent.

The optical image-recording material of the present invention can be prepared by coating on a support a dispersion of the microcapsules retaining the leuco dye and the photo-oxidizing agent, and the reducing agent.

To the above described dispersion of the microcapsules retaining the leuco dye and the photo-oxidizing agent, and the reducing agent, there may be added a binder, a pigment, a wax, a metal soap, a surface active agent, a melting point-decreasing agent such as p-benzyloxyphenol or p-toluenesulfonamide, and an acidic substance. The optical image-recording layer is coated in a solid amount of preferably 3 to 30 g/m$^2$, preferably 5 to 20 g/m$^2$.

As materials suitable for the support, there are illustrated papers from tissue paper to thick cardboard, regenerated cellulose, cellulose acetate, cellulose nitrate, polyethylene terephthalate, polyethylene, polyvinyl acetate, polymethyl methacrylate, polyvinyl chloride, etc.

As methods of coating on the support, there are illustrated an air knife coating method, a curtain coating method, a slide coating method, a roller coating method, a dip coating method, a wire bar coating method, a blade coating method, a gravure coating method, a spin coating method, an extrusion coating method, etc., which, however, are not limitative at all.

If necessary, a subbing layer may be provided on the support, or a covering layer may be provided on the optical image-recording layer. The subbing layer or the covering layer contains a binder and/or a pigment as a major component.

One general process for forming an image using the optical image-recording material of the present invention comprises imagewise exposing the material to form a colored image, then thermally fixing it. Another general process comprises imagewise thermo-printing the material, then causing coloration by irradiation with light. Either of the two processes may be employed.

In the former process, fixing of image may effectively be conducted by heating the material whereby the photo-oxidizing agent and the reducing agent are brought into contact with each other as a result of permeation through the capsule wall. Synergistic effects can be expected by simultaneously conducting heating and pressure application.

Proper selection of the kind of microcapsules enables one to fix the material only by pressure.

In the present invention, any light source can be used for activation of the photo-oxidizing agent and formation of an image from the leuco dye. As conventional light sources, there are illustrated, for example, a fluorescent lamp, a mercury lamp, a metal halide lamp, a xenon lamp and a tungsten lamp.

Heating may be conducted in various manners, but heating by means of a thermal head, a heated roller, a heated stamp or a hot plate is generally employed.

The present invention is now illustrated in greater detail by reference to the following examples which, however, are not to be construed as limiting the present invention in any way. Unless otherwise indicated all parts are by weight.

EXAMPLE 1

3 Parts of 9-(2-methoxycarbonylphenyl)-2-N-(2-ethylhexyl)-N-m-trifluoromethylphenylamino-6-diethylaminoxanthene, 3 parts of 2,2,-bis(o-chlorophenyl)-4,4',5,5'-tetraphenylbiimidazole, 0.6 part of tribromomethyl phenyl sulfone, 0.4 part of 2,5-di-tert-octylhydroquinone and 24 parts of a 75 wt% solution of xylylenediisocyanate/trimethylolpropane adduct in ethyl acetate were added to a mixed solvent of 22 parts of methylene chloride and 24 parts of tricresyl phosphate to prepare a solution. This solution was added to 63 parts of an 8% aqueous solution of carboxy-modified, polyvinyl alcohol, and emulsified and dispersed therein at 20° C. to obtain an emulsion having an average droplet size of 1 $\mu$m. 100 Parts of water was added to the resulting emulsion, followed by stirring the mixture for 3 hours at 40° C. Then, the temperature was decreased to room temperature, and the mixture was filtered to obtain a capsule dispersion.

Separately, 30 parts of 1-phenylpyrazolidin-3-one (Phenidone A) was added to 150 parts of a 4 wt% aqueous solution of carboxy-modified polyvinyl alcohol, and the mixture was milled in a horizontal sand mill to obtain a Phenidone A dispersion having an average oil droplet size of 1 μm.

Then, a coating solution of the following formulation was prepared.

| Capsule dispersion described above | |
| --- | --- |
| Phenidone A dispersion described above | |
| 20% Dispersion of silica (SYLOID 404, made by Fuji Davison Chemical Ltd.) | 20 parts |
| 30% Epoxidated polyamide resin (FL-71, made by Toho Chemical Industry Co., Ltd.) | 15 parts |
| 3% Aqueous solution of polyethylene glycol lauryl ether (Nippon Emulsion K.K.) | 10 parts |

This coating solution was coated on a wood free paper (76 g/m² in basis weight) in a solid amount of 10 g/m² using a coating rod, then dried at 50° C. to obtain an optical image-recording material.

This optical image-recording material was irradiated with a jet light (super-high pressure mercury lamp; made by ORC) through a line image to obtain a distinct black image. After the image formation, the sample was passed through a 120° C. heated roller to conduct fixing. When this sample was irradiated all over using the jet light in an irradiation amount 5 times as much as that for the imagewise exposure, the formed image did not change at all. The thus formed image showed an excellent stability.

EXAMPLES 2, 3 AND 4

Optical image-forming materials were obtained in the same manner as in Example 1 except for using 9-(2-methoxymethylphenyl)-2-N-ethyl-N-trifluoromethylphenyl-amino-6-diethylaminoxanthene (Example 2), 9-(2-acetyloxymethylphenyl)-2-N-ethyl-N-trifluoromethylphenylamino-6-diethylaminoxanthene (Example 3), 9-(2-dimethylaminocarbonylphenyl)-2-N-ethyl-N-trifluoromethylphenylamino-6-diethylaminoxanthene (Example 4), or 9-(2-ethoxycarbonylphenyl)-2-N-ethyl-N-m-trifluoromethylphenylamino-6diethylaminoxanthene (Example 5) in place of 9-(2-methoxycarbonylpheny)-2-N-(2-ethylhexyl)-N-trifluoromethylphenylamino-6-diethylaminoxanthene. The optical image-recording materials were irradiated with a jet light (super-high pressure mercury lamp; made by ORC) through a line image to obtain a distinct black image. After the image formation, the samples were passed through a 120° C. heated roller to conduct fixing. When the samples were irradiated all over using the jet light in a irradiation amount 5 times as much as that for the imagewise exposure, the formed images did not change at all. The thus formed images showed an excellent stability.

While the invention has been described in detail and with reference to specific embodiments thereof, it will be apparent to one skilled in the art that various changes and modifications can be made therein without departing from the spirit and scope thereof.

What is claimed is:

1. An optical image-recording material comprising:
   (a) microcapsules, in which at least one leuco dye capable of forming a color by oxidation and at least one photo-oxidizing agent are enclosed together, and (b) at least one reducing agent not enclosed in said micro-capsules, or
   (c) microcapsules, in which at least one reducing agent is enclosed, and (d) both at least one leuco dye capable of forming a color by oxidation and at least one photo-oxidizing agent not enclosed in said microcapsules,
   wherein said microcapsules have capsule walls made from a material which lowers its permeability barrier to at least one component selected from said photo-oxidizing agent and said reducing agent when the capsule wall material is heated above its glass transition temperature, and said leuco dye is represented by formula (I):

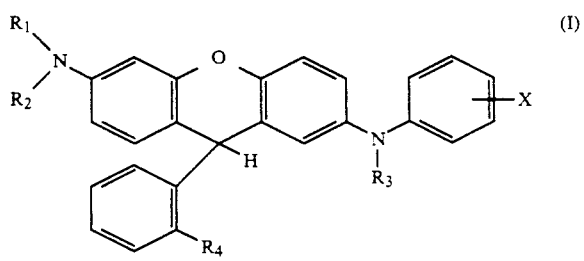

wherein $R_1$ and $R_2$, which may be the same or different, each represents an alkyl group, an alkenyl group, an alkynyl group or an aryl group, $R_3$ represents an alkyl group, $R_4$ represents an alkyl group, a carbamoyl group, a substituted amino group or $-COOR_5$ (wherein $R_5$ is an alkyl group), and X represents an electron attracting group.

2. The optical image-recording material of claim 1, wherein said $R_4$ is an alkyl group, an aryloxyalkyl group, an alkoxyalkyl group, a substituted carbamoyl group, an acylamino group or $-COOR_5$ (wherein $R_5$ is as defined above).

3. The optical image-recording material of claim 1, wherein X is selected from the group consisting of a trifluoromethyl group, a nitro group, an acyl group, an alkoxycarbonyl group, an aryloxycarbonyl group, an alkylsulfonyl group, an alkylsulfonyloxy group, an arylsulfonyl group, an arylsulfonyloxy group, an aryloxysulfonyl group, an N-substituted carbamoyl group, an N-substituted sulfamoyl group, a halogen atom and a cyano group.

4. The optical image-recording material of claim 2, wherein X is selected from the group consisting of a trifluoromethyl group, an alkylsulfonyl group, an arylsulfonyl group, an N,N-dialkylsulfamoyl group, and an aryloxysulfonyl group.

5. The optical image-recording material of claim 1, wherein the photo-oxidizing agent is a lophine dimer compound, an azide compound, a pyridinium compound, an organic halogen compound or an azide polymer.

6. The optical image-recording material of claim 1, wherein the reducing agent is a hydroquinone compound, an aminophenol compound, a cyclic phenylhydrazide compound, a guanidine derivative, an alkylenediamine derivative or a hydroxyamine derivative.

7. The optical image-recording material of claim 1, wherein at least one of a leuco dye, the photo-oxidizing agent and the reducing agent is microencapsulated.

8. The optical image-recording material of claim 7, wherein the leuco dye, both the leuco dye and the photo-oxidizing agent or the reducing agent is microencapsulated.

9. The optical image-recording material of claim 8, wherein the leuco dye and the photo-oxidizing agent are microencapsulated.

10. The optical image-recording material of claim 1, wherein a phenol type antioxidant is contained in said microcapsules (a).

11. The optical image-recording material of claim 10, wherein said phenol type antioxidant is added in an amount of 0.001 to 20 mol% based on the photo-oxidizing agent.

* * * * *